United States Patent
Fu et al.

(10) Patent No.: US 11,527,573 B2
(45) Date of Patent: Dec. 13, 2022

(54) GAN-BASED THRESHOLD SWITCHING DEVICE AND MEMORY DIODE

(71) Applicants: Kai Fu, Tempe, AZ (US); Houqiang Fu, Tempe, AZ (US); Yuji Zhao, Chandler, AZ (US)

(72) Inventors: Kai Fu, Tempe, AZ (US); Houqiang Fu, Tempe, AZ (US); Yuji Zhao, Chandler, AZ (US)

(73) Assignee: Arizona Board of Regents on behalf of Arizona State University, Scottsdale, AZ (US)

( * ) Notice: Subject to any disclaimer, the term of this patent is extended or adjusted under 35 U.S.C. 154(b) by 129 days.

(21) Appl. No.: 17/215,282

(22) Filed: Mar. 29, 2021

(65) Prior Publication Data
US 2021/0242281 A1 Aug. 5, 2021

Related U.S. Application Data

(62) Division of application No. 16/666,978, filed on Oct. 29, 2019, now Pat. No. 10,964,749.

(60) Provisional application No. 62/754,258, filed on Nov. 1, 2018.

(51) Int. Cl.
| | |
|---|---|
| H01L 27/24 | (2006.01) |
| H01L 45/00 | (2006.01) |
| G11C 13/00 | (2006.01) |
| H01L 29/66 | (2006.01) |
| H01L 29/861 | (2006.01) |
| H01L 29/20 | (2006.01) |

(52) U.S. Cl.
CPC ...... *H01L 27/2427* (2013.01); *G11C 13/0002* (2013.01); *H01L 29/2003* (2013.01); *H01L 29/66204* (2013.01); *H01L 29/861* (2013.01); *H01L 45/12* (2013.01); *H01L 45/1608* (2013.01)

(58) Field of Classification Search
CPC .......... H01L 27/2427; H01L 29/2003; H01L 29/66204; H01L 29/861; H01L 45/12; H01L 45/1608; G11C 13/0002
See application file for complete search history.

(56) References Cited

U.S. PATENT DOCUMENTS

| | | | |
|---|---|---|---|
| 10,700,218 B2 | 6/2020 | Zhao et al. | |
| 2013/0032814 A1 | 2/2013 | Bour et al. | |
| 2014/0312355 A1 | 10/2014 | Kizilyalli et al. | |
| 2018/0182882 A1* | 6/2018 | Hashimoto | ....... H01L 21/28575 |

(Continued)

OTHER PUBLICATIONS

U.S. Appl. No. 16/811,355, filed Mar. 6, 2020, Huang et al.
(Continued)

*Primary Examiner* — Shahed Ahmed
*Assistant Examiner* — Vicki B. Booker
(74) *Attorney, Agent, or Firm* — Fish & Richardson P.C.

(57) ABSTRACT

A switching device including a GaN substrate; an unintentionally doped GaN layer on a first surface of the GaN substrate; a regrown unintentionally doped GaN layer on the unintentionally doped GaN layer; a regrowth interface between the unintentionally doped GaN layer and the regrown unintentionally doped GaN layer; a p-GaN layer on the regrown unintentionally doped GaN layer; a first electrode on the p-GaN layer; and a second electrode on a second surface of the GaN substrate.

10 Claims, 6 Drawing Sheets

(56) References Cited

U.S. PATENT DOCUMENTS

2020/0227546 A1     7/2020    Huang et al.

OTHER PUBLICATIONS

U.S. Appl. No. 16/818,659, filed Mar. 13, 2020, Montes et al.
Aluguri et al., "Overview of Selector Devices for 3-D Stackable Cross Point RRAM Arrays," IEEE Journal of the Electron Devices Society, Sep. 2016, 4:294-306, doi: 10.1109/JEDS.2016.2594190.
Calka et al., "Chemical and structural properties of conducting nanofdaments in TiN/HfO2-based resistive switching structures," Nanotechnology, Feb. 2013, 24(8):085706 (1-9), doi:10.1088/0957-4484/24/8/085706.
Cavallini et al., "Regenerable resistive switching in silicon oxide based nanojunctions," Adv Mater, Mar. 2012, 24:1197-201, doi: 10.1002/adma.201104301.
Cha et al., "Comprehensive scaling study of NbO2 insulator-metal-transition selector for cross point array application," Applied Physics Letters, Apr. 2016, 108:153502-1-153502-3, doi: 10.1063/1.4945367.
Chen et al., "Annealing effect on the bipolar resistive switching characteristics of a Ti/Si3N4/n-GaN MIS device," Journal of Alloys and Compounds, Jan. 2018, 740:816-822, doi: 10.1016/j.jallcom.2018.01.072.
Chen et al., "Reproducible bipolar resistive switching in entire nitride AlN/n-GaN metal-insulator-semiconductor device and its mechanism," Applied Physics Letters, Nov. 2014, 105:193502-1-193502-5, doi: 10.1063/1.4901747.
Chen, "Memory selector devices and crossbar array design: a modeling-based assessment," Journal of Computational Electronics, Sep. 2017, 16:1186-1200, doi: 10.1007/s10825-017-1059-7.
Czubatyj et al., "Invited paper: Thin-film Ovonic threshold switch: Its operation and application in modern integrated circuits," Electronic Materials Letters, Apr. 2012, 8:157-167, doi: 10.1007/s13391-012-2040-z.
Gopalakrishnan et al., "Highly-scalable novel access device based on Mixed Ionic Electronic conduction (MIEC) materials for high density phase change memory (PCM) arrays," 2010 Symposium on VLSI Technology, Honolulu, Hawaii, USA, 2010, pp. 205-206, doi: 10.1109/VLSIT.2010.5556229.
Govoreanu et al., "High-Performance Metal-Insulator-Metal Tunnel Diode Selectors", IEEE Electron Device Letters, Jan. 2014, 35(1):63-65, doi:10.1109/LED.2013.2291911.
Kim et al., "Nanoscale resistive memory with intrinsic diode characteristics and long endurance," Applied Physics Letters, Feb. 2010, 96:053106-1-053106-3, doi: 10.1063/1.3294625.
Koo et al., "Simple Binary Ovonic Threshold Switching Material SiTe and Its Excellent Selector Performance for High-Density Memory Array Application," IEEE Electron Device Letters, May 2017, 38:568-571, doi: 10.1109/LED.2017.2685435.
Kwon et al., "Atomic structure of conducting nanofilaments in TiO2 resistive switching memory," Nat Nanotechnol, Feb. 2010, 5:148-53, doi: 10.1038/nnano.2009.456.
Lee et al., "2-stack 1D-1R Cross-point Structure with Oxide Diodes as Switch Elements for High Density Resistance RAM Applications," 2007 IEEE International Electron Devices Meeting, Washington, DC, USA, 2007, pp. 771-774, doi: 10.1109/IEDM.2007.4419061.
Lee et al., "Varistor-type bidirectional switch (JMAX>107A/cm2, selectivity~104) for 3D bipolar resistive memory arrays" 2012 Symposium on VLSI Technology (VLSIT), Honolulu, HI, USA, 2012, pp. 37-38, doi: 10.1109/VLSIT.2012.6242449.
Lim et al., "Excellent threshold switching device (Ioff~ 1 pA) with atom-scale metal filament for steep slope (< 5 mV/dec), ultra low voltage (Vdd= 0.25 V) FET applications," 2016 IEEE International Electron Devices Meeting (IEDM), San Francisco, CA, USA, 2016, pp. 34.7.1-37.7.4, doi: 10.1109/IEDM.2016.7838543.
Liu et al., "Memory effect of Al-rich AlN films synthesized with rf magnetron sputtering," Applied Physics Letters, Jul. 2005, 87:033112-1-033112-3, doi: 10.1063/1.2000337.
Song et al., "Threshold Selector With High Selectivity and Steep Slope for Cross-Point Memory Array," IEEE Electron Device Letters, May 2015, 36:681-683, doi: 10.1109/LED.2015.2430332.
Tran et al., "Self-rectifying and forming-free unipolar HfOx based-high performance RRAM built by fab-available materials," 2011 International Electron Devices Meeting, pp. 31.2.1-31.2.4, Dec. 2011, doi: 10.1109/IEDM.2011.6131648.
Virwani et al., "Sub-30nm scaling and high-speed operation of fully-confined Access-Devices for 3D crosspoint memory based on mixed-ionic-electronic-conduction (MIEC) materials," 2012 International Electron Devices Meeting, San Francisco, CA, USA, 2012, pp. 2.7.1-2.7.4, doi: 10.1109/IEDM.2012.6478967.
Yoo et al., "Threshold switching behavior of Ag—Si based selector device and hydrogen doping effect on its characteristics," AIP Advances, 2015, 5:127221.
Yu, "Resistive Random Access Memory (RRAM): From Devices to Array Architectures," Synthesis Lectures on Emerging Engineering Technologies, Morgan & Claypool, 2016, 2:1-79, doi: 10.2200/S00681ED1V01Y201510EET006.
Zhao et al. "Flexible cation-based threshold selector for resistive switching memory integration," Science China Information Sciences, Jun. 2018, 61:060413-1-060413-8, doi: 10.1007/s11432-017-9352-0.

\* cited by examiner

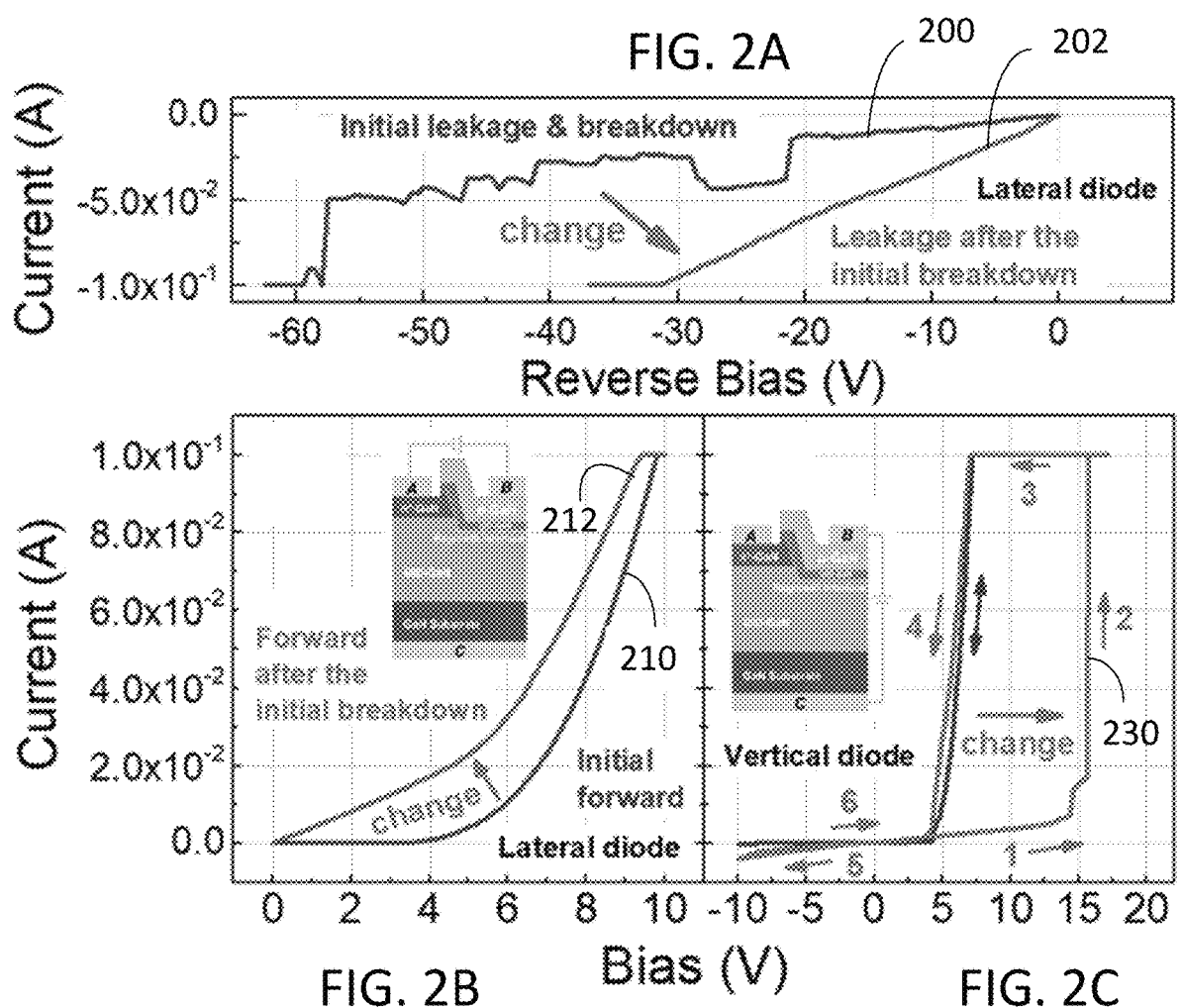

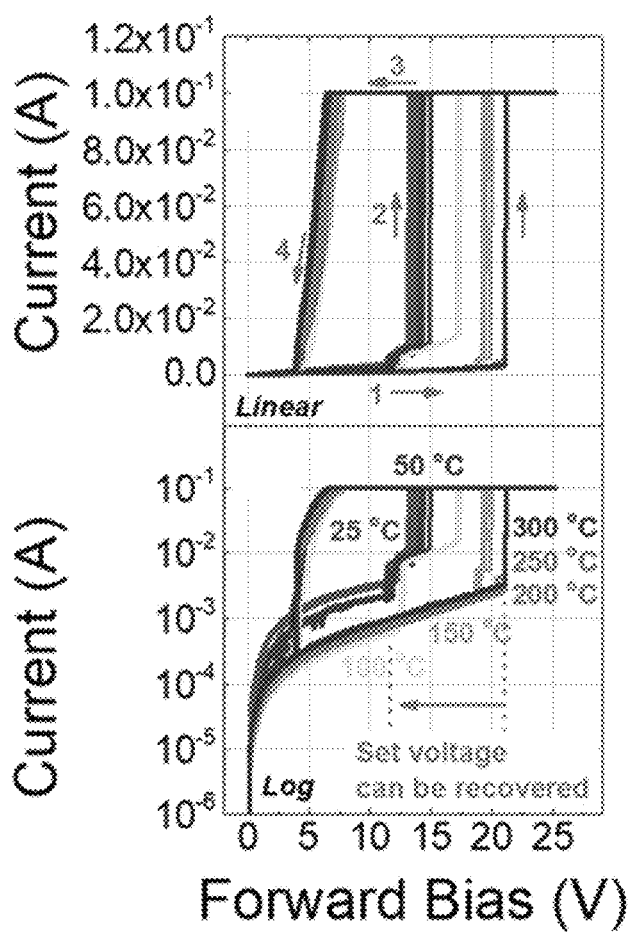
FIG. 4A
FIG. 4C
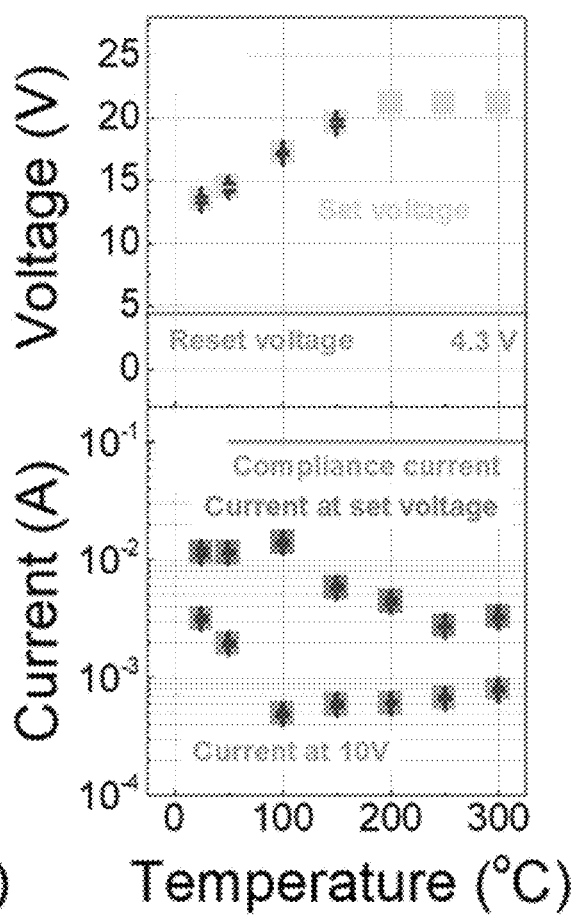
FIG. 4B
FIG. 4D

GAN-BASED THRESHOLD SWITCHING DEVICE AND MEMORY DIODE

CROSS-REFERENCE TO RELATED APPLICATIONS

This application is a divisional of U.S. patent application Ser. No. 16/666,978 entitled "GaN-BASED THRESHOLD SWITCHING DEVICE AND MEMORY DIODE" and filed on Oct. 29, 2019, which claims the benefit of U.S. Patent Application No. 62/754,258 entitled "GaN-BASED THRESHOLD SWITCHING DEVICE AND MEMORY DIODE" and filed on Nov. 1, 2018, which are incorporated by reference herein in their entirety.

STATEMENT OF GOVERNMENT SUPPORT

This invention was made with government supported under AR0000868 awarded by the Department of Energy and 80NSSC17K0768 awarded by the National Aeronautics and Space Administration. The government has certain rights in the invention.

TECHNICAL FIELD

This invention relates to threshold switching and memory devices based on epitaxially regrown GaN-on-GaN vertical p-n diodes.

BACKGROUND

Resistive random access memory (RRAM) is recognized as one of the most promising memories due to its excellent scalability, low programming voltage, and fast write/read speed. For stand-alone and large capacity nonvolatile memory (NVM), the cross-point (or crossbar) array is an attractive architecture for configuring the RRAM. To cut off the sneak path current of the unselected cells for a large-scale cross-point array, RRAMs with self-rectification characteristics can be used, or a selector device (with asymmetry or nonlinearity) can be added in series with the RRAM cell at each cross-point. Some threshold switching selector devices have been proposed, including as p-n diodes, bidirectional varistors, mixed-ion-electronic-conduction (MIEC) devices, ovonic threshold switching (OTS) devices, metal-insulator transition (MIT) devices, and programmable metallization cell (PMC) devices. However, these devices can have a limited lifetime under certain environmental conditions.

SUMMARY

Threshold switching and memory devices based on epitaxially regrown GaN-on-GaN vertical p-n diodes described in this specification include conductive filaments formed by Si atoms at the regrowth interface. The devices include lateral and vertical p-n junctions. The vertical junction demonstrates threshold switching after soft breakdown of either the lateral or vertical junction. The device provides reliable switching with more than 1000 cycles, with very small fluctuation on set voltage and current at high resistance state (HRS). The set voltage increases with increasing temperature to reach a substantially constant level above 200° C. HRS I-V curves follow the space charge limited current (SCLC) mechanism, and the device possesses memory when the reset voltage is higher than about 4.4 V.

In a first general aspect, fabricating a switching device includes depositing a first unintentionally doped GaN layer on a first surface of a GaN substrate; depositing a $n^+$-GaN layer on the first unintentionally doped GaN layer; etching away a portion of the $n^+$-GaN layer and a portion of the first unintentionally doped GaN layer to yield a first etched surface and a second etched surface on the first unintentionally doped GaN layer; regrowing a second unintentionally doped GaN layer on the first etched surface and the second etched surface of the first unintentionally doped GaN layer; regrowing a p-GaN layer on the second unintentionally doped GaN layer; etching away a portion of the p-GaN layer and the second unintentionally doped GaN layer to yield an etched surface on the $n^+$-GaN layer; forming a first electrode on the etched surface of the $n^+$-GaN layer; forming a second electrode on the p-GaN layer; and forming a third electrode on a second surface of the GaN substrate.

Implementations of the first general aspect may include one or more of the following features.

A lateral p-n junction is defined between the first electrode and the second electrode. A vertical p-n junction is defined between the second electrode and the third electrode. Etching away the portion of the $n^+$-GaN layer and the portion of the first unintentionally doped GaN layer includes forming a mesa pattern. Regrowing the second unintentionally doped GaN layer includes regrowing the second unintentionally doped GaN layer on a first etched surface and a second etched surface of the $n^+$-GaN layer. The first etched surface of the first unintentionally doped GaN layer and the first etched surface of the $n^+$-GaN layer are substantially parallel. The second etched surface of the first unintentionally doped GaN layer and the second etched surface of the $n^+$-GaN layer form a path between the first etched surface of the first unintentionally doped GaN layer and the first etched surface of the $n^+$-GaN layer.

In a second general aspect, fabricating a switching device includes depositing a first unintentionally doped GaN layer on a first surface of a GaN substrate; etching away a portion of the first unintentionally doped GaN layer to yield an etched surface on the first unintentionally doped GaN layer; regrowing a second unintentionally doped GaN layer on the etched surface of the first unintentionally doped GaN layer; regrowing a p-GaN layer on the second unintentionally doped GaN layer; forming a first electrode on the p-GaN layer; and forming a second electrode on a second surface of the GaN substrate.

Implementations of the second general aspect may include one or more of the following features.

A vertical p-n junction is defined between the first electrode and the second electrode. Etching away the portion of the first unintentionally doped GaN layer includes forming a mesa pattern.

In a third general aspect, a switching device includes a GaN substrate; an unintentionally doped GaN layer on a first surface of the GaN substrate; a regrown unintentionally doped GaN layer on the unintentionally doped GaN layer; a regrowth interface between the unintentionally doped GaN layer and the regrown unintentionally doped GaN layer; a p-GaN layer on the regrown unintentionally doped GaN layer; a first electrode on the p-GaN layer; and a second electrode on a second surface of the GaN substrate.

Implementations of the third general aspect may include one or more of the following features.

The device includes a $n^+$-GaN layer on the unintentionally doped GaN layer. The regrown unintentionally doped GaN layer is in direct contact with the $n^+$-GaN layer and the unintentionally doped GaN layer. A portion of the p-GaN layer is formed over the n+-GaN layer. The device includes a third electrode on the n+-GaN layer. The first electrode and the third electrode form a lateral p-n junction. The first electrode and the third electrode form a vertical p-n junction. The regrowth interface comprises silicon atoms. The device is configured to possess, during operation, a low resistive state facilitated by an electrically conducting path formed by the silicon atoms when a forward bias voltage is applied between the first electrode and the second electrode. The device is configured to possess, during operation, a high resistive state facilitated by an insulating layer formed at the regrowth interface after a soft breakdown.

Advantages of the threshold switching and memory behavior of epitaxially regrown GaN-on-GaN vertical p-n diodes described in this specification include reproducible switching behavior, good operational endurance, and high temperature stability.

The details of one or more embodiments of the subject matter of this disclosure are set forth in the accompanying drawings and the description. Other features, aspects, and advantages of the subject matter will become apparent from the description, the drawings, and the claims.

BRIEF DESCRIPTION OF DRAWINGS

FIGS. 2A-2C are plots showing measured current-voltage (I-V) curves of Device A before and after the soft breakdown. FIGS. 2A and 2B show reverse and forward I-V curves, respectively, of a lateral diode in a switching device. FIG. 2C shows curves of a vertical diode in a switching device.

FIGS. 4A and 4B show forward I-V characteristics of a vertical diode in Device A at different temperatures in linear and semi-logarithmic scales, respectively. FIGS. 4C and 4D show set voltage and current at HRS versus temperature, respectively. Five sweeping cycles were carried out at each temperature.

DETAILED DESCRIPTION

Figures 1A, 1B, 1C:
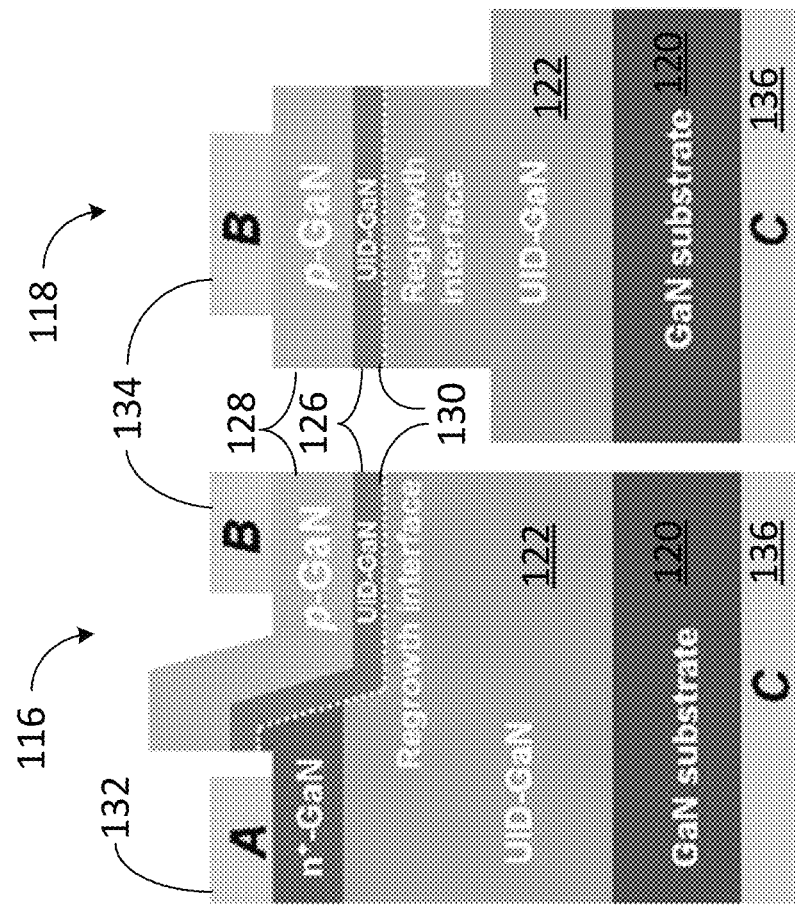
FIG. 1A is a flow chart showing operations in a process of fabricating a switching device.
FIGS. 1B and 1C depict cross-sectional views of Devices A and B, respectively, fabricated by the process in FIG. 1A.

FIG. 1A illustrates schematically the flow of a process 100 for fabrication of switching devices depicted in FIGS. 1B and 1C. In 102, a GaN substrate 120 is provided. In 104, an unintentionally doped (UID) GaN layer 122 (also referred to interchangeably as an undoped or substantially undoped GaN layer, in which the background level of doping is about $10^{15}$ cm$^{-3}$ or so) and an optional n+-GaN layer 124 are grown on the GaN substrate 120. In 106, a portion of GaN is etched away (e.g., with inductively coupled plasma (ICP)) to form mesa patterns. In 108, UID-GaN layer 126 and p-GaN layer 128 are successively regrown on the etched surface at regrowth interface 130. In 110, an ohmic contact area for electrode layers is formed by ICP etching. In 112, deeper etching is carried out with electron-beam evaporation to form mesa isolation, followed by fabricating one or both of electrode 132 (Electrode A) and 134 (Electrode B) with electron-beam evaporation. Electrodes 132 and 134 are typically metal stacks (e.g., Ti/Al/Ni/Au or Pd/Ni/Au, respectively). In 114, a metal stack is deposited on the back side of the GaN substrate to form ohmic contacts for electrode 136 (Electrode C). Examples of fabricated devices 116 (Device A) and 118 (Device B) are depicted in FIGS. 1B and 1C, respectively.

In some embodiments, operations in process 100 can be added, omitted, performed in a different order than depicted, or any combination thereof. In one example, Device A is fabricated with n+-GaN layer 124 and electrode 132, both of which features are absent in Device B.

EXAMPLES

Growth and Device Fabrication

Devices were homoepitaxially grown with metalorganic chemical vapor deposition (MOCVD) on c-plane n-GaN free-standing substrates with a carrier concentration of ~$10^{18}$ cm$^{-3}$ (available from Sumitomo Electric Industries Ltd). The growth temperature was ~1040° C. and hydrogen (H$_2$) was used as the carrier gas. Trimethylgallium (TMGa), ammonia (NH$_3$), silane (SiH$_4$), and bis(cyclopentadienyl) magnesium (Cp$_2$Mg) were used as the precursors for Ga, N, Si dopants, and Mg dopants, respectively.

FIG. 1A illustrates schematically the flow of a process 100 of fabrication of switching device 116 (Device A) depicted in FIG. 1B. At steps 102, 104, an approximately 7 μm thick unintentionally doped (UID) GaN layer 122 (also referred to interchangeably as an undoped GaN layer, in which the background level of doping is about $10^{15}$ cm$^{-3}$ or so) and an approximately 1 μm thick n+-GaN layer 124 were first grown on the GaN substrate 120.

An approximately 1.5 μm thick portion of GaN was etched away with inductively coupled plasma (ICP) to form mesa patterns. Then, a 300 nm UID-GaN layer 122 and 1 μm p-GaN layer 128 were successively regrown on the etched surface, followed by ICP-etching to form an ohmic contact area for electrode layers (or, electrodes, for short). Deeper etching was carried out to form mesa isolation, after which the electrode 132 (Electrode A) and electrode 134 (Electrode B) were fabricated with electron-beam evaporation with metal stacks of Ti/Al/Ni/Au (20/130/50/150 nm) and Pd/Ni/Au (10/20/30 nm), respectively. The Ti/Al/Ni/Au metal stacks were also deposited on the back side of the GaN substrate to form ohmic contacts for electrode 136 (Electrode C).

The measurements of electrical characteristics of these devices were performed on a probe station with a thermal chuck. Current-voltage (I-V) characteristics were measured using a Keithley 2400 sourcemeter. The compliance current was set to 100 mA. Results for Device A are described below.

Electrical Characteristics

FIG. 2A show reverse leakage curves of the lateral p-n junction (between electrodes B-A) in Device A before and after the initial soft breakdown (see curves 200, 202 respectively), while FIG. 2B shows a change (from curve 210 to curve 212) in the forward I-V characteristic for the lateral p-n junction of the same device. Both the reverse and forward leakage curves are change with larger leakage before the turn-on voltage.

I-V characteristics of the vertical p-n junction (between electrodes B-C) in Device A demonstrated stable hysteresis (or threshold switching behavior), especially for the forward bias part, as shown in FIG. 2C with curve 230. Numerals 1-6 and arrows in FIG. 2C are used to indicate the sequence of sweeping voltage throughout the hysteresis cycle. The threshold switching process included high resistance state (HRS) and low resistance state (LRS). The switching event from FIRS to LRS is referred to as a "set" process; the reciprocal switching event is referred to as a "reset" process; and the reverse soft breakdown is referred to as a "forming" process. Since the device is a p-n diode, the emission and disappearance of blue light from the p-n junction, observed during the process of characterization of the device, was another indicator of the present switching process.

Both the soft breakdown of the lateral p-n junction and the soft breakdown of the vertical p-n junction in Device A could be used as the forming process, whereas the soft breakdown of the lateral p-n junction was shown to be more effective (almost 100%). No such transformation behavior was observed in conventional vertical GaN p-n diodes fabricated without the "etch-then-regrowth" process as described herein. Therefore, the observed threshold switching behavior is believed to be related at least in part to (e.g., caused at least in part by, or affected at least in part by) the presence of regrowth interface.

Curve 230 in FIG. 2C shows that Device A also demonstrated that threshold switching occurred after the soft breakdown of the vertical p-n junction, attributed at least in part to the formation of the regrowth interface in the device. That is, the presence of the regrowth interface is believed to be responsible at least in part for the threshold switching behavior demonstrated by Device A. The somewhat different efficiency of the forming process of Device B compared to that of device A may be attributed to the different electric field distribution in these two types of devices, since the electric field at the corner of the regrowth interface was larger, thereby leading to an easier forming process). Here, the term "forming process" is used in reference to memory devices to indicate that after the soft breakdown has occurred, the device exhibits threshold switching, memory behavior, or both. Device A was shown to reliably switch more than 1,000 cycles with a very small fluctuation in set voltage and current at HRS, as shown in FIGS. 3A and 3B.

Figures 3A, 3B:
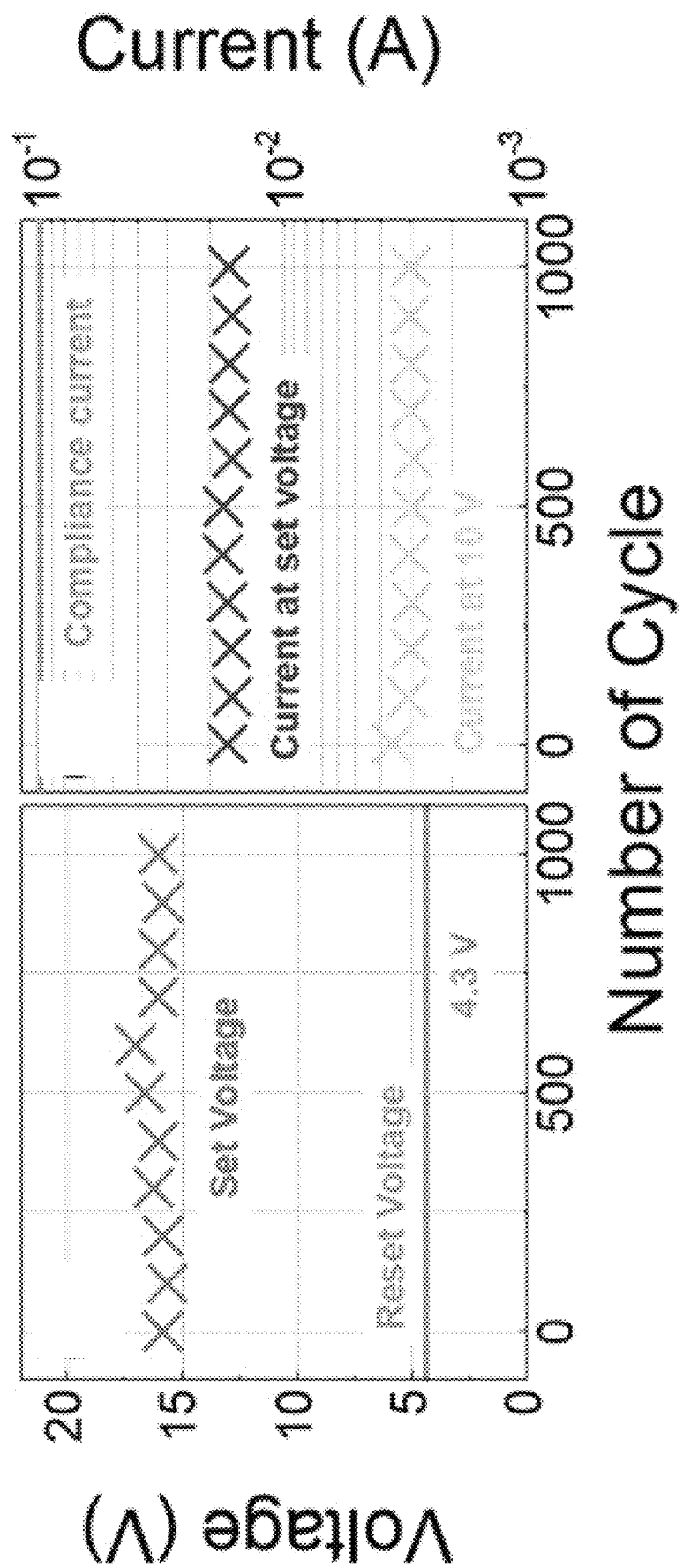
FIG. 3A shows a cycling demonstration of a vertical diode in in Device A on set voltage.
FIG. 3B shows a cycling demonstration of a vertical diode in Device A at high resistance state (HRS).

After the more-than-1,000 cycle endurance test (the results of which are shown in FIGS. 3A and 3B), the high-temperature test of operation of the embodiments (with temperatures ramping up to 300° C.) was carried out. FIGS. 4A and 4B show the I-V characteristics of Device A on linear and semi-logarithmic scales, respectively. The set voltage was observed to increase with increasing temperature and become substantially constant (at a level of about 21.2 V) above 200° C., as shown in FIG. 4C. FIG. 4D shows the current at HRS, which decreased with increasing temperature. In multiple experiments, all these parameters were shown to recover to the corresponding room-temperature values (when the temperature was decreased to the room temperature). After the first high temperature cycle, the set voltage at room temperature decreased to ~13.4 V from ~16 V (shown in FIG. 3A). The set voltage remained at this value at room temperature in the following high temperature test, where the initial high temperature cycle acted as an aging process for the device.

Figures 5A, 5B:
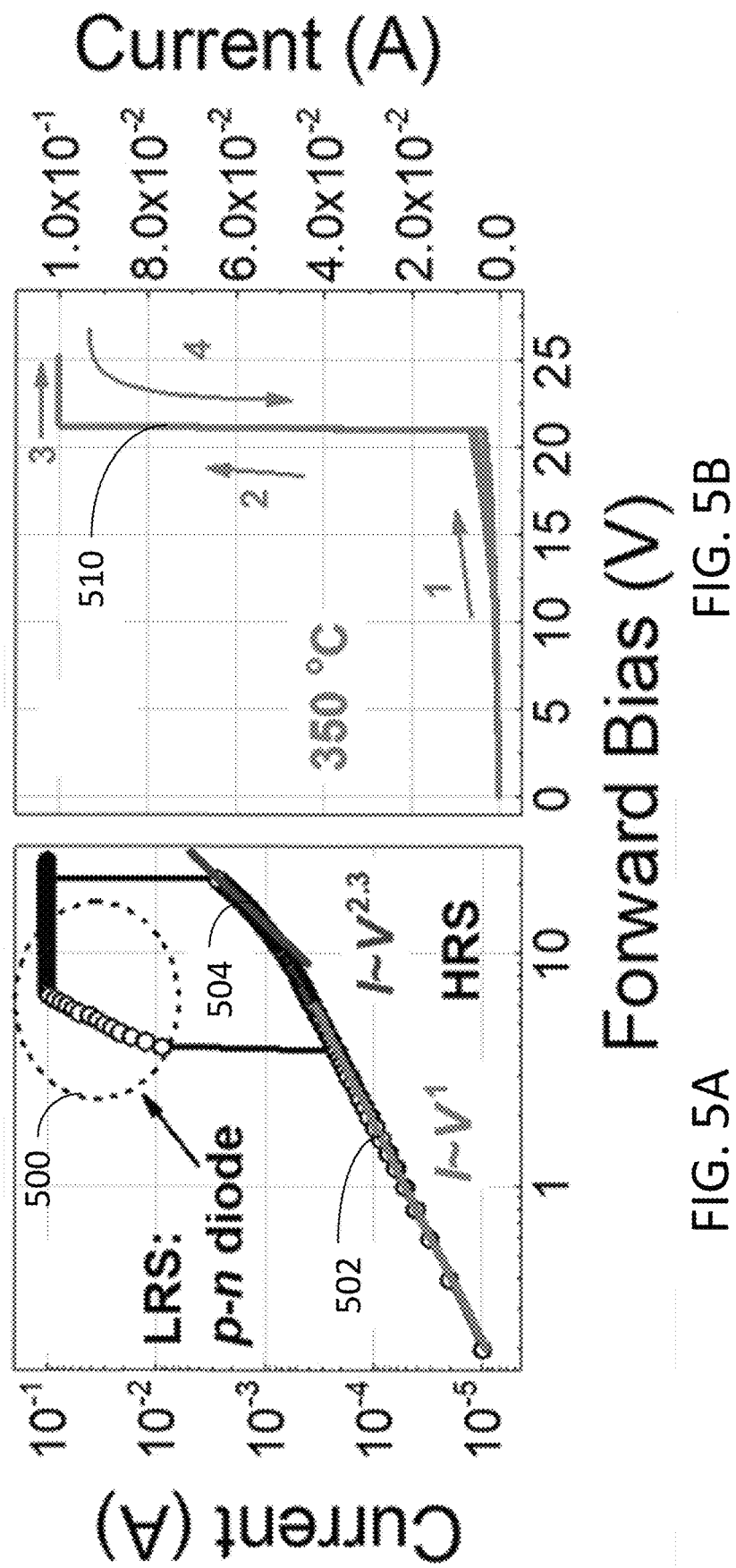
FIG. 5A shows log-log scale I-V curves at different temperatures with linear fitting at some of segments of curves.
FIG. 5B shows I-V curves of a vertical diode of Device A at 350° C. with 5 sweeping cycles.

The high-temperature I-V curves were re-plotted on a double logarithmic scale to understand the threshold switching mechanism of the p-n junction of Device A, as shown in FIG. 5A. Here, the LRS I-V curves 500 are shown to follow the p-n diode characteristics, whereas the FIRS I-V curves follow the space charge limited current (SCLC) characteristic (the Ohmic region I~V 502, and the Child's square law region I~V2 504).

Thus, a regrowth interface region, formed as a result of the fabrication methodology described herein, has been shown to define a thin insulating layer after the soft breakdown, which facilitates the formation of the HRS.

Empirical assessment of the regrowth interface with the secondary ion-mass spectroscopy showed a high-concentration Si-atom presence at the regrowth interface. These Si-atoms are thought to form the Si-based conductive filament when the high forward voltage was applied, leading to the p-n diode performance or the LRS.

At elevated temperatures, the performance of the device changes: since higher temperature leads to more intense atomic thermal motion, such motion can hinder the formation of the conductive filament at the elevated temperatures, which in turn can lead to the increased set voltage and decreased FIRS current.

Device A demonstrated smaller threshold switching at reverse bias at least in part because the voltage mostly dropped at the depletion region of the p-n junction. When the temperature exceeded 350° C., the conductive filament formed and was maintained when the forward bias was higher than the set voltage after the set process, as shown with 510 in FIG. 5B. However, the reset process recovered (shown in FIGS. 4A and 4B) when the temperature decreased.

Figures 6A, 6B:
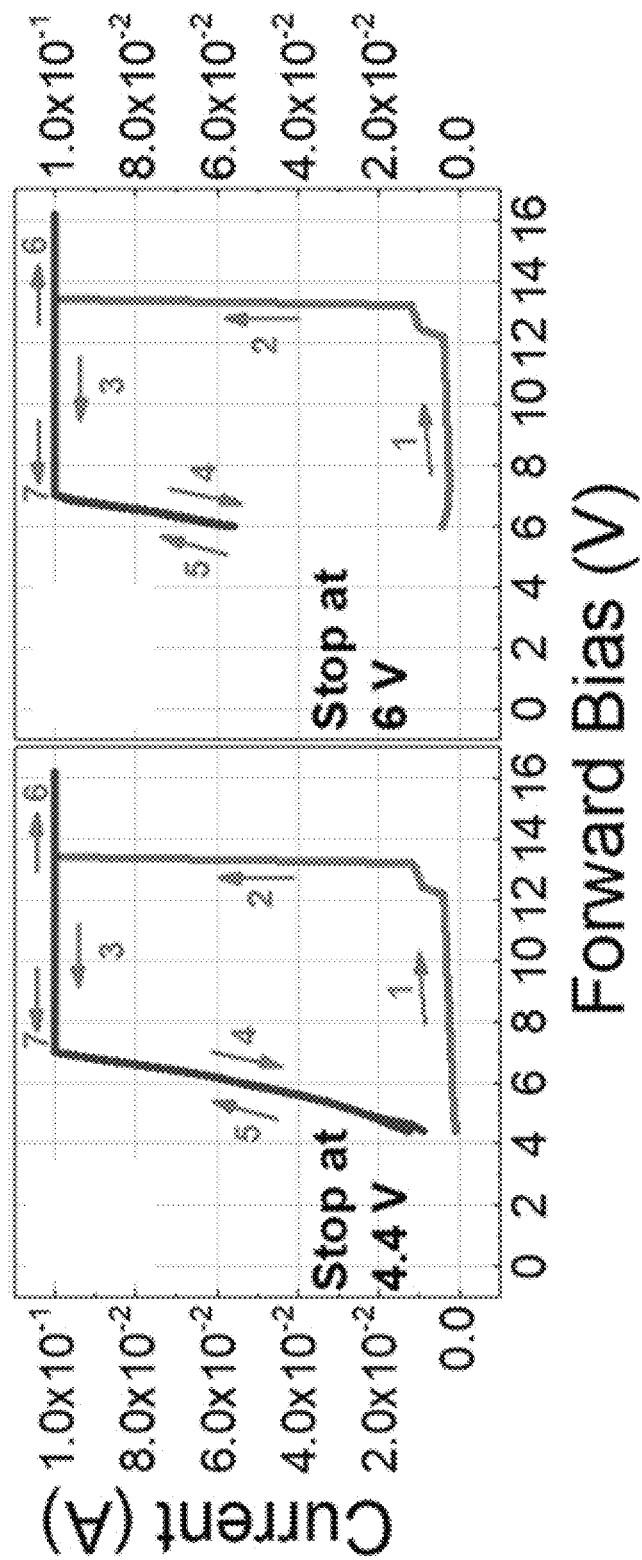
FIGS. 6A and 6B show I-V curves of a vertical diode in Device A with different scan voltages starting at 4.4 V and 6 V, respectively. Numbers indicate the scan direction. Five sweeping cycles were carried out for each scan condition.

The Si-based conductive filament in Device A was maintained when the forward bias was a little higher (that is, about 1 V higher) than the turn-on voltage of the GaN p-n diode. Such memory behavior, characterized by varying the sweeping stop voltage (or reset voltage) at about 4.4 V and about 6 V, is shown in FIGS. 6A and 6B, respectively. Device A switched from HRS to LRS when the forward bias was higher than the set voltage (~13.4 V at room temperature). When the reset voltage was higher than about 4.4 V, the device remained in LRS, otherwise it switched back to HRS.

Overall, the epitaxially regrown GaN-on-GaN vertical p-n diodes demonstrated threshold switching and memory behavior after soft breakdown due at least in part to the presence of the regrowth interface. The threshold switching operation of the device was repeatable and stable at high temperatures.

Although this disclosure contains many specific embodiment details, these should not be construed as limitations on the scope of the subject matter or on the scope of what may be claimed, but rather as descriptions of features that may be specific to particular embodiments. Certain features that are described in this disclosure in the context of separate embodiments can also be implemented, in combination, in a single embodiment. Conversely, various features that are described in the context of a single embodiment can also be implemented in multiple embodiments, separately, or in any suitable sub-combination. Moreover, although previously described features may be described as acting in certain combinations and even initially claimed as such, one or more features from a claimed combination can, in some cases, be excised from the combination, and the claimed combination may be directed to a sub-combination or variation of a sub-combination.

Particular embodiments of the subject matter have been described. Other embodiments, alterations, and permutations of the described embodiments are within the scope of the following claims as will be apparent to those skilled in the art. While operations are depicted in the drawings or claims in a particular order, this should not be understood as requiring that such operations be performed in the particular order shown or in sequential order, or that all illustrated operations be performed (some operations may be considered optional), to achieve desirable results.

Accordingly, the previously described example embodiments do not define or constrain this disclosure. Other changes, substitutions, and alterations are also possible without departing from the spirit and scope of this disclosure.

What is claimed is:

1. A method for fabricating a switching device, the method comprising:
   depositing a first unintentionally doped GaN layer on a first surface of a GaN substrate;
   depositing a $n^+$-GaN layer on the first unintentionally doped GaN layer;
   etching away a portion of the $n^+$-GaN layer and a portion of the first unintentionally doped GaN layer to yield a first etched surface and a second etched surface on the first unintentionally doped GaN layer;
   regrowing a second unintentionally doped GaN layer on the first etched surface and the second etched surface of the first unintentionally doped GaN layer;
   regrowing a p-GaN layer on the second unintentionally doped GaN layer;
   etching away a portion of the p-GaN layer and the second unintentionally doped GaN layer to yield an etched surface on the $n^+$-GaN layer;
   forming a first electrode on the etched surface of the $n^+$-GaN layer;
   forming a second electrode on the p-GaN layer; and
   forming a third electrode on a second surface of the GaN substrate.

2. The method of claim 1, wherein a lateral p-n junction is defined between the first electrode and the second electrode.

3. The method of claim 1, wherein a vertical p-n junction is defined between the second electrode and the third electrode.

4. The method of claim 1, wherein etching away the portion of the $n^+$-GaN layer and the portion of the first unintentionally doped GaN layer comprises forming a mesa pattern.

5. The method of claim 1, wherein regrowing the second unintentionally doped GaN layer further comprises regrowing the second unintentionally doped GaN layer on a first etched surface and a second etched surface of the $n^+$-GaN layer.

6. The method of claim 5, wherein the first etched surface of the first unintentionally doped GaN layer and the first etched surface of the $n^+$-GaN layer are substantially parallel.

7. The method of claim 5, wherein the second etched surface of the first unintentionally doped GaN layer and the second etched surface of the $n^+$-GaN layer form a path between the first etched surface of the first unintentionally doped GaN layer and the first etched surface of the $n^+$-GaN layer.

8. A method for fabricating a switching device, the method comprising:
   depositing a first unintentionally doped GaN layer on a first surface of a GaN substrate;
   etching away a portion of the first unintentionally doped GaN layer to yield an etched surface on the first unintentionally doped GaN layer;
   regrowing a second unintentionally doped GaN layer on the etched surface of the first unintentionally doped GaN layer;
   regrowing a p-GaN layer on the second unintentionally doped GaN layer;
   forming a first electrode on the p-GaN layer; and
   forming a second electrode on a second surface of the GaN substrate.

9. The method of claim 8, wherein a vertical p-n junction is defined between the first electrode and the second electrode.

10. The method of claim 8, wherein etching away the portion of the first unintentionally doped GaN layer comprises forming a mesa pattern.

* * * * *